US008786828B2

(12) United States Patent
Finders

(10) Patent No.: US 8,786,828 B2
(45) Date of Patent: *Jul. 22, 2014

(54) LITHOGRAPHIC APPARATUS AND DEVICE MANUFACTURING METHOD

(71) Applicant: Jozef Marie Finders, Veldhoven (NL)

(72) Inventor: Jozef Marie Finders, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/848,595

(22) Filed: Mar. 21, 2013

(65) Prior Publication Data
US 2013/0222779 A1    Aug. 29, 2013

Related U.S. Application Data

(63) Continuation of application No. 13/159,979, filed on Jun. 14, 2011, now Pat. No. 8,416,394, which is a continuation of application No. 12/488,291, filed on Jun. 19, 2009, now Pat. No. 7,982,856.

(60) Provisional application No. 61/129,407, filed on Jun. 24, 2008.

(51) Int. Cl.
G03B 27/72 (2006.01)
G03B 27/54 (2006.01)
G03F 7/20 (2006.01)

(52) U.S. Cl.
CPC .................. G03F 7/70191 (2013.01)
USPC ............................. 355/71; 355/67

(58) Field of Classification Search
CPC ............ G03F 7/70191; G03F 7/70141; G03F 7/70466

USPC ......... 355/52, 53, 55, 67–71; 250/548, 492.2; 356/399–401

See application file for complete search history.

(56) References Cited

U.S. PATENT DOCUMENTS 6,310,679 B1   10/2001   Shiraishi
6,455,438 B1   9/2002    Yanagisawa et al.

(Continued)

FOREIGN PATENT DOCUMENTS

JP   2007-317847   12/2007
KR   2009-0126216  12/2009

OTHER PUBLICATIONS

Korean Office Action dated Jan. 19, 2011 in corresponding Korean Patent Application No. 10-2009-0055987.

Primary Examiner — Hung Henry Nguyen
(74) Attorney, Agent, or Firm — Pillsbury Winthrop Shaw Pittman LLP

(57) ABSTRACT

A lithographic apparatus includes a phase adjuster to adjust a phase of an optical wave traversing an optical element of the phase adjuster during exposure of a pattern on a substrate. In use, the pattern is illuminated with an illumination mode including an off-axis radiation beam. This beam is diffracted into a number of first-order diffracted beams, one associated with a first pitch in the pattern, along a first direction, another associated with a second pitch along a different, second direction. An area is identified where the first-order diffracted beam associated with the first pitch traverses the optical element. An image characteristic of an image of the pattern is optimized by calculating a desired optical phase of this first-order diffracted beam in relation to the optical phase of the other first-order diffracted beam. The phase adjuster is controlled to apply the desired optical phase to the first order diffracted beam.

19 Claims, 12 Drawing Sheets

(56) References Cited

U.S. PATENT DOCUMENTS

| | | |
|---|---|---|
| 6,541,167 B2 | 4/2003 | Petersen et al. |
| 6,549,266 B1 | 4/2003 | Taniguchi |
| 7,525,640 B2 | 4/2009 | Jansen et al. |
| 7,961,296 B2 * | 6/2011 | Finders ............................ 355/67 |
| 7,982,856 B2 * | 7/2011 | Finders ............................ 355/71 |
| 8,054,449 B2 | 11/2011 | Sewell |
| 8,164,741 B2 | 4/2012 | Finders |
| 2009/0296060 A1 | 12/2009 | Finders |

* cited by examiner

LITHOGRAPHIC APPARATUS AND DEVICE MANUFACTURING METHOD

This application is a continuation of U.S. patent application Ser. No. 13/159,979, filed Jun. 14, 2011, now U.S. Pat. No. 8,416,394, which is a continuation of U.S. patent application Ser. No. 12/488,291, filed Jun. 19, 2009, now U.S. Pat. No. 7,982,856, which claims priority and benefit under 35 U.S.C. §119(e) to U.S. Provisional Patent Application No. 61/129,407, entitled "Lithographic Apparatus and Device Manufacturing Method", filed on Jun. 24, 2008. The contents of each of the foregoing applications are incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to impart a beam of radiation with a pattern in its cross-section, the pattern corresponding to a circuit pattern to be formed on an individual layer of the IC. This pattern can be imaged or transferred onto a target portion (e.g. comprising part of one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an image of the entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the semiconductor manufacturing industry there is increasing demand for ever-smaller features and increased density of features. The desired critical dimension (CD) of a smallest feature to be printed lithographically is rapidly decreasing and is becoming very close to the theoretical resolution limit of state-of-the-art exposure tools such as steppers and scanners as described above. Conventional technologies aimed at enhancing resolution and minimizing printable CD include reducing the wavelength of the exposure radiation, increasing the numerical aperture (NA) of the projection system of the lithographic apparatus, and/or including features in a patterning device pattern smaller than the resolution limit of the exposure tool so that they will not print on the substrate, but so that they will produce diffraction effects which can improve contrast and sharpen fine features.

When such conventional resolution enhancement techniques are applied to a lithographic printing process wherein a desired pattern to be printed is repetitive along two different directions, the repetitiveness characterized by two corresponding different pitches, a size-error of a feature as printed may be beyond tolerance. This may be due to a problem known as the optical proximity effect. This is caused by the inherent difference in the diffraction pattern for isolated features as compared to dense features. Dense features may include nested patterns and closely spaced periodic features. The optical proximity effect may, for example, lead to a difference in CD when dense and more isolated contact holes or lines are printed at the same time.

The optical proximity effect also depends on the illumination setting used. Originally, so-called conventional illumination modes have been used which have a disc-like intensity distribution of the illumination radiation at the pupil of the projection system. However, with the trend to imaging smaller features, off-axis illumination modes have become standard in order to improve the process window, i.e. the exposure latitude in combination with depth of focus, for small features. However, the optical proximity effect becomes worse for off-axis illumination modes, such as annular illumination.

SUMMARY

It is desirable, for example, to alleviate, at least partially, a problem of optical proximity effect and/or one or more other problems not mentioned herein.

According to an aspect of the invention, there is provided a lithographic apparatus comprising:

an illumination system configured to condition a radiation beam with an illumination mode including an off-axis radiation beam emerging from an illumination pole and inclined at an angle with respect to an optical axis;

a support constructed to support a patterning device, the patterning device being capable of imparting the radiation beam with a pattern in its cross-section to form a patterned radiation beam and further being capable of diffracting the off-axis radiation beam into a first first-order diffracted beam associated with a first pitch of the pattern along a first direction, and a second first-order diffracted beam associated with a second pitch of the pattern along a different, second direction;

a projection system having a pupil plane and configured to project the patterned radiation beam onto a target portion of the substrate;

a phase adjuster constructed and arranged to adjust a phase of an electric field of a radiation beam traversing an optical element of the phase adjuster disposed in the pupil plane; and a controller constructed and arranged to retrieve data representative of the pattern and of the illumination mode, to identify an area where the first-order diffracted beam traverses, in use, the pupil plane, to optimize an image characteristic of an image of the pattern by calculating a desired optical phase of the first-order diffracted beam in relation to the optical phase of the second first-order diffracted beam, to map the area on a portion of the optical element, and to apply heat to or extract heat from, the portion to change the index of refraction of the optical element in accordance with the desired optical phase.

According to an aspect of the invention, there is provided a device manufacturing method comprising transferring a pattern from a patterning device onto a substrate, the method including:

illuminating, with a radiation beam having an illumination mode including an off-axis radiation beam emerging from an illumination pole and inclined at an angle with respect to an optical axis, a patterning device, the patterning device imparting the radiation beam with a pattern in its cross-section to form a patterned radiation beam and further diffracting the off-axis radiation beam into a first first-order diffracted beam associated with a first pitch along a first direction in the pattern, and into a second first-order diffracted beam associated with a second pitch along a different, second direction in the pattern;

projecting the patterned radiation beam via a pupil plane onto a target portion of the substrate;

adjusting a phase of an electric field of a radiation beam traversing an optical element disposed in the pupil plane, the adjusting including:

retrieving data representative of the pattern and of the illumination mode, identifying an area where the first-order diffracted beam traverses the pupil plane, optimizing an image characteristic of an image of the pattern by calculating a desired optical phase of the first-order diffracted beam in relation to the optical phase of the second first-order diffracted beam, mapping the area on a portion of the optical element, and applying heat to or extracting heat from, the portion to change the index of refraction of the optical element in accordance with the desired optical phase.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
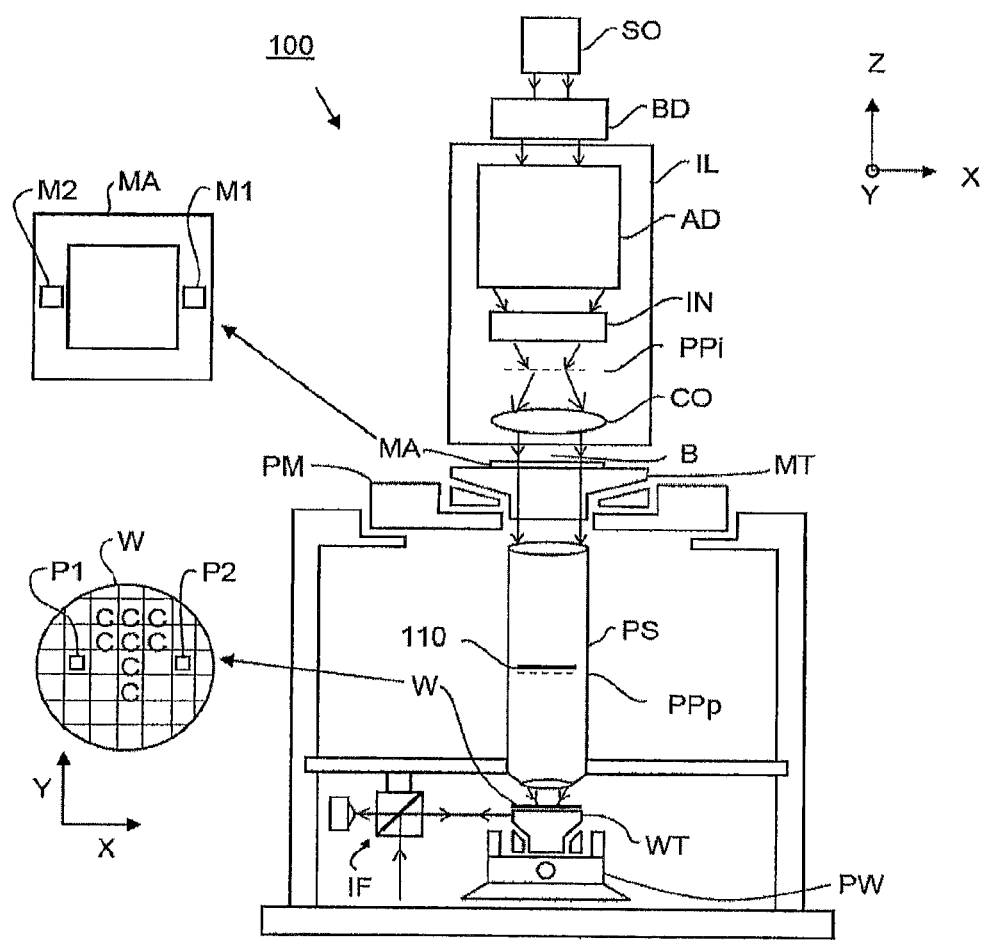
FIG. 1 depicts a lithographic apparatus according to an embodiment of the invention.

FIG. 1 schematically depicts a lithographic apparatus 100 according to an embodiment of the invention. The apparatus 100 comprises:

an illumination system (illuminator) IL configured to condition a radiation beam B (e.g. UV radiation such as generated by an excimer laser operating at a wavelength of 248 nm or 193 nm, or EUV radiation as generated by, for example, a laser-fired plasma source operating at 13.6 nm wavelength);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. It holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus 100 is of a transmissive type (e.g. employing a transmissive mask). Alternatively, the apparatus may be of a reflective type (e.g. employing a programmable mirror array of a type as referred to above, or employing a reflective mask).

The lithographic apparatus 100 may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

The lithographic apparatus 100 may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device table MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus 100 could be used in at least one of the following modes:

In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The optical arrangement of the apparatus of FIG. 1 uses Koehler illumination. With Koehler illumination, a pupil plane $PP_i$ in the illumination system IL is conjugate to a pupil plane $PP_p$ of the projection system PS. The pupil plane $PP_p$ is a Fourier transform plane of the object plane in which the patterning device MA is located. As is conventional, an illumination mode of this apparatus can be described by reference to the distribution of intensity of the radiation of the beam B in the pupil plane $PP_i$ of the illumination system. The distribution of intensity in the pupil plane $PP_p$ of the projection system PS will be substantially the same as the distribution of intensity in the pupil plane $PP_i$ of the illumination system, subject to diffraction effects of the pattern of the patterning device MA.

The projection system PS comprises a phase adjuster 110 constructed and arranged to adjust a phase of an electric field of an optical radiation beam traversing the projection system.

Figure 2:
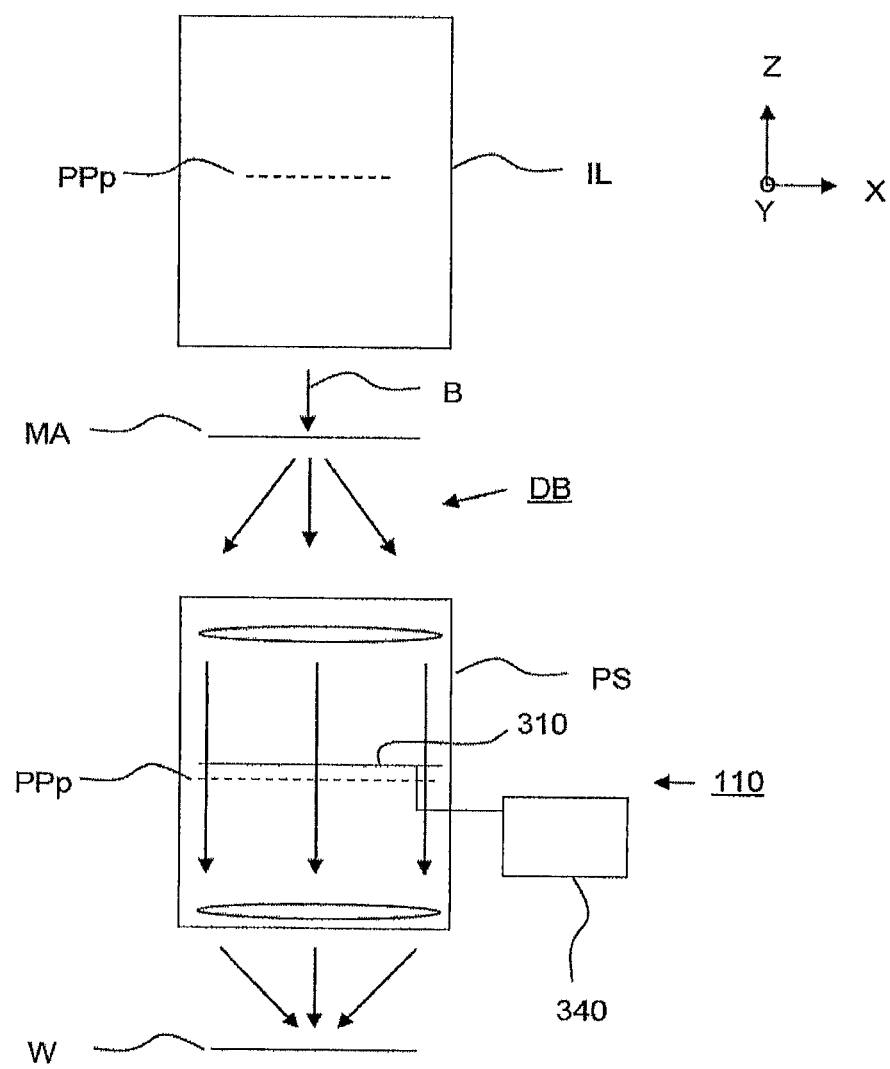
FIG. 2 illustrates a phase adjuster configured to change a phase of an electromagnetic wave traversing a projection system of the lithographic apparatus.

As schematically shown in FIG. 2, the phase adjuster 110 may comprise an optical element 310 of a material substantially transmissive for radiation of the beam B. In an embodiment, the optical element 310 may be reflective for radiation of the beam 340. The phase adjuster 110 may further comprise a controller 340. An optical path length for a wave traversing the element 310 is adjustable in response to a signal supplied by controller 340. The optical element 310 may be disposed or disposable, for example, substantially in a Fourier Transform plane such as the pupil PPp, and such that—in use—it is traversed by diffracted beams DB emanating from the patterning device.

Figure 3:
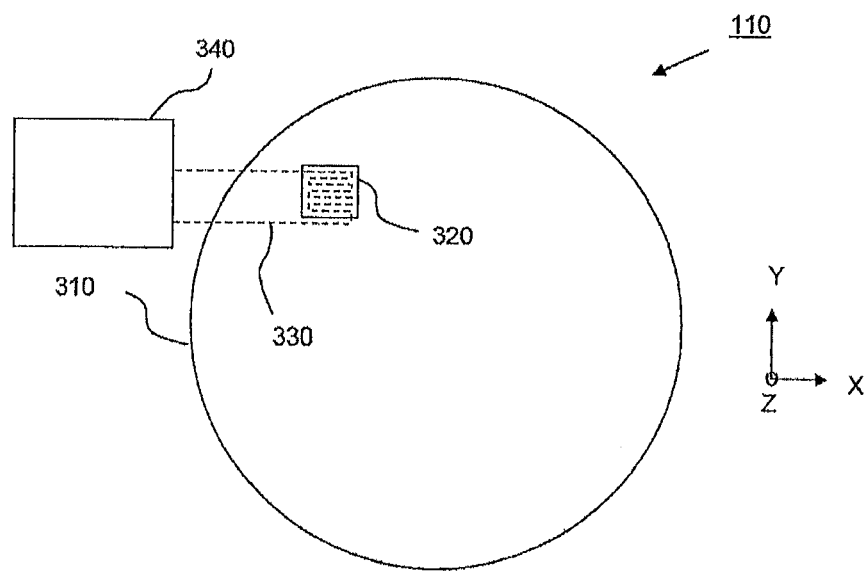
FIG. 3 illustrates an optical element included in the phase adjuster.

FIG. 3 illustrates the phase adjuster 110 in more detail, and shows a top view, along the Z-axis, of the optical element 310. An adjustment of a phase of an optical wave traversing the element 310 may be obtained by applying heat to, or removing heat from, a portion 320 of the optical element 310, thereby introducing a local change of index of refraction of the material of the element relative to the refractive index of the material adjacent to the portion 320. The application of heat can be realized by, for example, transmitting an electrical current through a wire 330 having Ohmic resistance and being arranged in contact with the portion 320 of the element and with the controller 340 arranged to provide the current to the wire 330.

Figure 4:
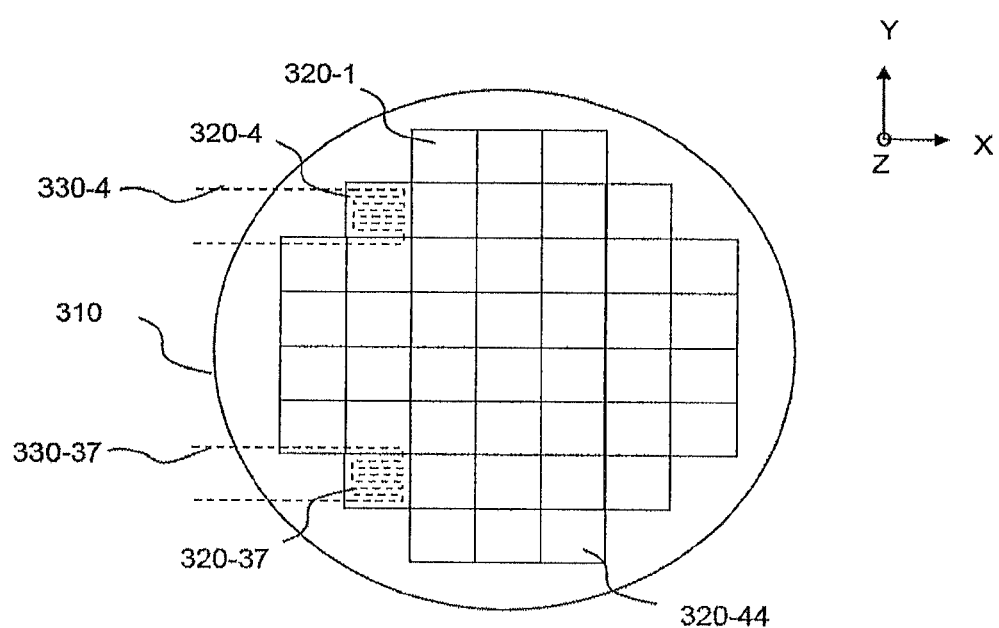
FIG. 4 depicts temperature controllable portions of the optical element included in the phase adjuster.

A plurality of adjacent portions of the optical element may be provided with a corresponding plurality of wires for heating any portion independently from any other portion. For example, as schematically illustrated in FIG. 4, adjacent portions 320-1 up to 320-44 are disposed in adjacent rows and numbered from left to right and from top to bottom. Each portion 320 of the portions 320-1 up to 320-44 is provided with correspondingly numbered heating wires 330-1 up to 330-44 (although FIG. 4, merely for clarity sake, illustrates this only for the portions 320-4 and 320-37). The controller 340 is constructed and arranged such that each wire can be current-activated independently. This enables application of a spatial phase distribution to an optical wave traversing the element 310, in accordance with a spatial distribution of the temperature over the element 310 in the X,Y plane.

In addition or alternatively, the optical element 310 may include a channel arranged to contain a cooling fluid. The phase adjuster 110 may include a cooling fluid supply and retrieval system connected to the channel and arranged to circulate cooling fluid at a controlled temperature through the channel. Like the wires 330, a cooling channel may be associated with each portion 320; however, alternatively a single cooling channel may be arranged for all portions 320. A cooling of the element 310 in combination with heating a portion 320 of the element 310 may enable adjusting the temperature of the portion 320 within a range of temperatures extending both below and above a nominal temperature. The nominal temperature may, for example, be a specified desired operating temperature of the apparatus 100 or of the material of the optical elements of the projection system PS.

Embodiments of a phase adjuster 110 can be gleaned from U.S. Pat. No. 7,525,640. A total number of portions 320 is not limited to 44. Instead it may in general depend on a desired spatial resolution of temperature distributions. For example, a ratio of the area of each of the portions 320 to the size of a clear area in the pupil plane PPi of the projection system PS may be between 100 and 1000.

It is noted that the invention is not limited to the specific embodiment, described above, of the phase adjuster 110. Such an embodiment is presented herein for illustrative purposes only. As a further example, a phase adjuster 110 may include an infrared laser (or a plurality of infrared lasers) arranged to selectively heat portions 320 of an optical element 310 disposed near the lens pupil $PP_p$. Infrared radiation may be guided to selected portions of the optical element by means of, for example, one or more hollow optical fibers. Details of such an embodiment can be gleaned from Japanese patent application publication no. JP 2007-317847 A. In the absence of cooling structure, temperatures of different portions 320 can be arranged to mutually differ from each other by supplying corresponding mutually different amounts of infrared radiation energy to the corresponding different portions. A nominal temperature may then be specified as, for example, the average temperature value of the mutually different temperatures.

Figure 5:
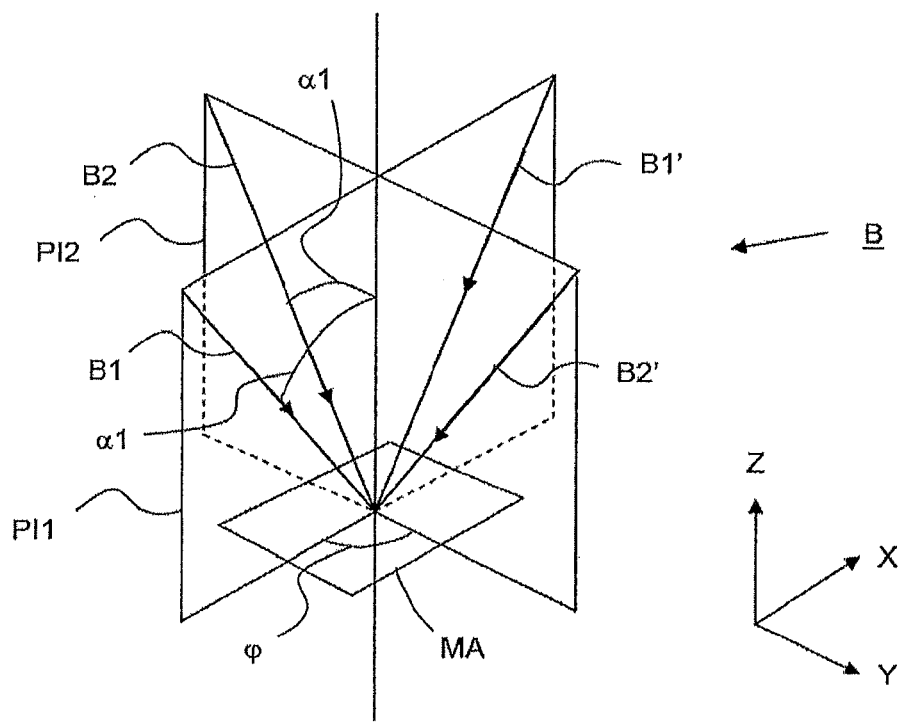
FIG. 5 depicts a quadrupole illumination mode.

In the embodiment, a patterning device pattern provided by the patterning device MA is illuminated using a conventional quadrupole illumination mode, illustrated in FIG. 5. The beam B includes a first radiation beam B1 inclined at an angle α1 with respect to the Z-axis (which is substantially normal to the patterning device MA) in a first plane of incidence PI1 and a second radiation beam B2, also inclined at an angle α1 with respect to the patterning device in a second plane of incidence PI2. The second plane of incidence PI2 is arranged at an angle φ with respect to the plane PI1. The beam B further includes beams B1' and B2' respectively arranged symmetrically opposite to the respective beams B1 and B2. The angle φ is 90 degrees in the embodiment, but is not limited to this value. The planes PI1 and PI2 are respectively an X-Z plane and an Y-Z plane in the embodiment, but can also be chosen at other rotational orientations with respect to the Z-axis.

Figure 6A:
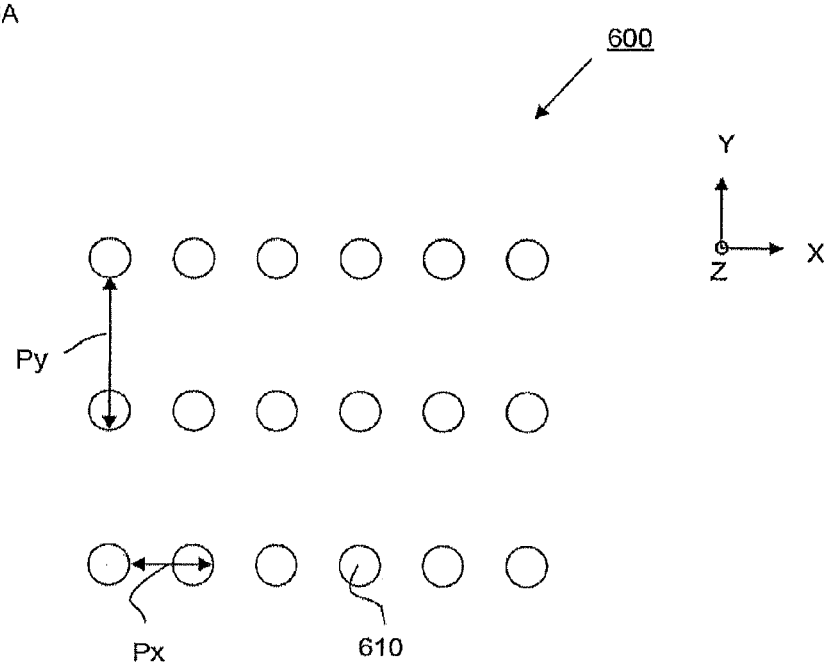
FIG. 6A illustrates a pattern of contact holes generated by a patterning device.

The pattern 600 includes rows of contact holes 610 as shown in FIG. 6A. The rows are aligned with the X-direction and each row includes contact holes 610 arranged at a pitch Px. The contact holes 610 are also disposed in rows along the Y-direction. Along the rows along the Y-direction the contact holes 610 are arranged at a pitch Py. The pitch Py is larger than the pitch Px. Such a contact hole pattern may be, for example, a pattern used to print a pattern of dense contact holes using a so called double exposure lithographic method including two exposure steps. The two exposure steps are part of two respective lithographic printing processes. In the first lithographic printing process a first pattern 600 of contact holes is formed on a substrate. In the subsequent, second lithographic process a second pattern 600 of contact holes is formed on the substrate, the second process being arranged such as to position the second pattern 600 of contact holes in interlaced position with respect to the first pattern 600 of contact holes. Such a double exposure method can be gleaned from U.S. Pat. No. 6,455,438.

In current apparatus employing patterning by a mask on a mask table, in general, the projection system will have a magnification factor M (generally <1). For example, the imaging of the pattern onto the target portion of the substrate by conventional lithographic projection systems is arranged at a magnification M=−0.25. As discussed and shown herein the magnification M is assumed to be 1, so that the pattern of FIG. 6A is also representative for an image of the desired pattern of contact holes to be printed lithographically. However, an embodiment of the invention is not limited to the use of unit magnification projection systems; for magnifications different from 1 the actual magnification can readily be taken into account in the embodiment. In the context of the present text and claims; sizes of features are referred to as those sizes that the features nominally have at substrate level.

In practice, the shape of a contact hole 610 as embodied at the patterning device may deviate from circular. For example, the shape of the patterning device feature representing the contact hole may be arranged to compensate for an optical proximity effect, as discussed earlier. Generally, additional size deviations at the patterning device are introduced to compensate for errors occurring, for example, during projection and exposure of a pattern; such a re-sizing of features of the object pattern is referred to hereinafter as biasing and/or optical proximity correction ("OPC"). Any such biasing is not shown in FIG. 6A.

Figure 6B:
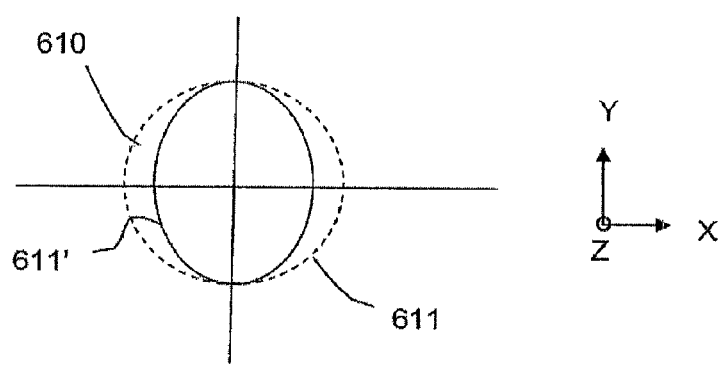
FIG. 6B illustrates a desired shape of a contact hole of the pattern of FIG. 6A and a simulated shape as printed of the contact hole.

With the pitch Py being larger than the pitch Px, a printed pattern may deviate from the desired pattern 600 due to an optical proximity effect. An optical proximity effect would in the embodiment lead to contact holes 610 having an elliptical shape instead of a substantially circular shape, as illustrated in FIG. 6B. Any of the contact holes 610 may, for example, desirably have a circular edge 611, "circular" also meaning substantially circular, whereas, a printed contact hole 610 may have an elliptical edge 611'. Hence, a size of a printed contact hole 610 along the X-direction differs from a size of the contact hole along the Y-direction. Such a size-difference is also referred to, hereinafter, as "ellipticity". In the embodiment a conventional optical proximity correction may have been applied, in which case a residual amount of CD-error such as an ellipticity of the contact hole as illustrated in FIG. 6B is assumed to be present.

In the embodiment, the value of pitch Px is 80 nm, and the value of Pitch Py is between 160 nm and 320 nm. The desired diameter of the contact holes 610 is 40 nm. The projection process for printing the pattern 600 is characterized by the projection system PS having an NA of 1.35, the radiation of the beam B having a wavelength of 193 nm, and the quadrupole illumination mode having poles with an azimuthal angular subtend of 30°, an inner radial extent defined by $\sigma_{inner}$=0.75, and an outer radial extent defined by $\sigma_{outer}$=0.87.

Figure 7:
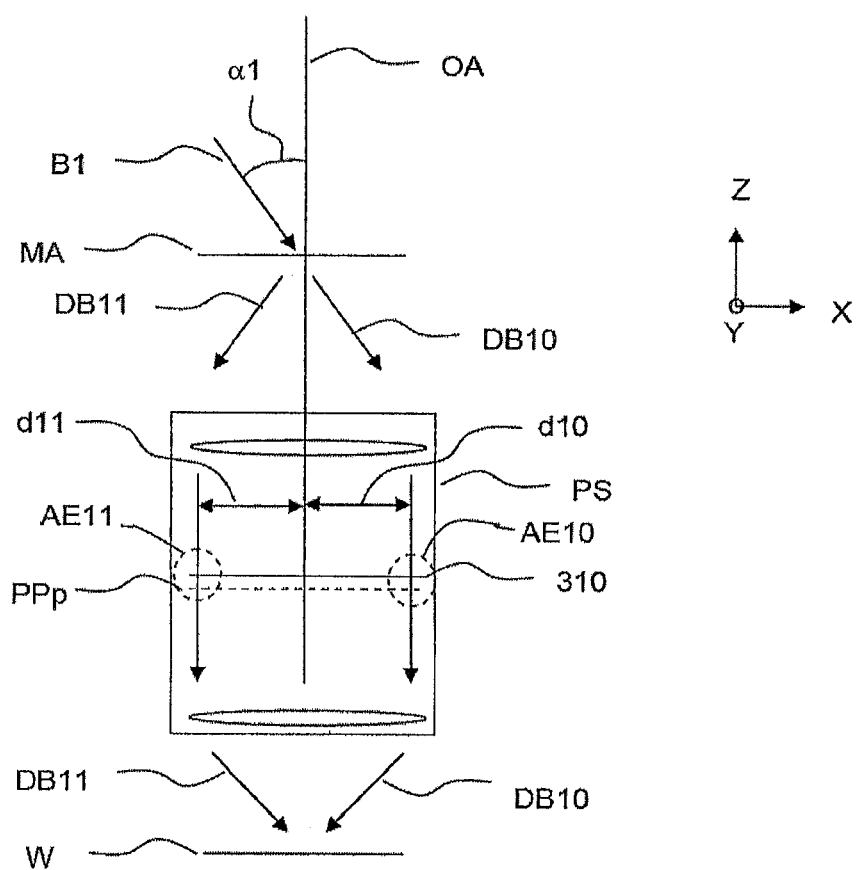
FIG. 7 depicts diffracted beams originating from a single illumination beam of the quadrupole illumination mode.

As illustrated in FIG. 7, the patterning device pattern 600 (not shown in FIG. 7) of patterning device MA diffracts the beam B1 into a zero and a first order diffracted beam, respectively the beams DB10 and DB11. The beams DB10 and DB11 traverse a Fourier Transform plane in the projection system PS, e.g. the pupil plane PPp. The angle α1 is arranged such that the traversing of the pupil plane PPp occurs in respective opposite areas AE10 and AE11 disposed symmetrically with respect to the optical axis OA (parallel to the Z-axis), at respective equal distances d10 and d11 (d10=d11) from the optical axis OA.

Figure 8:
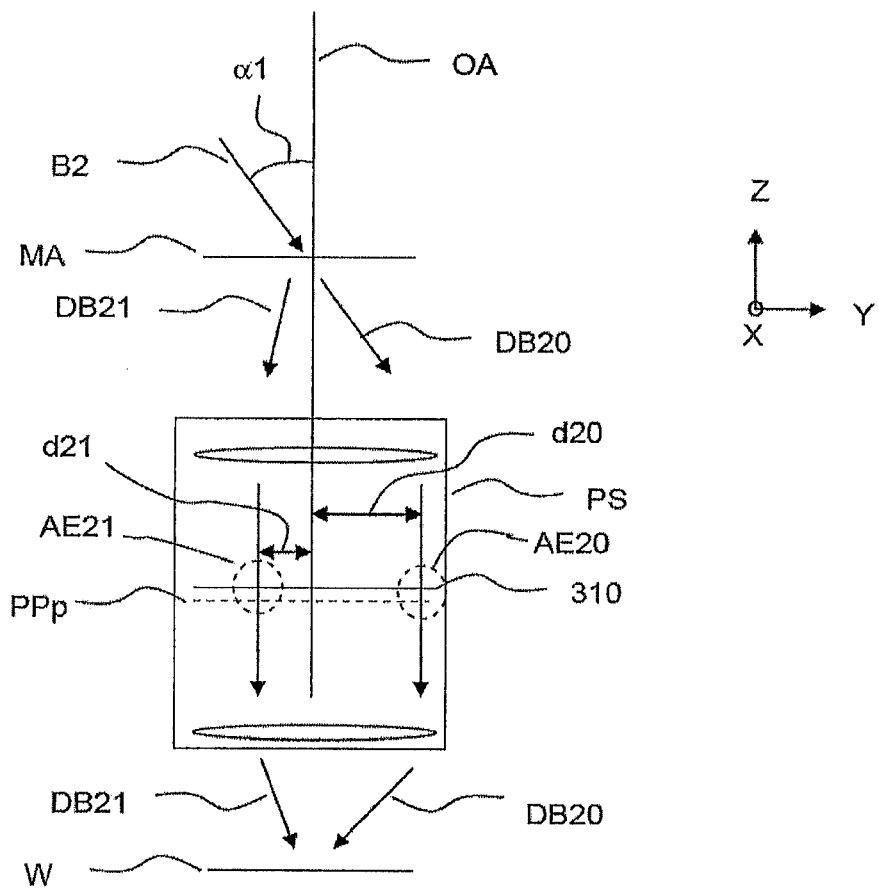
FIG. 8 depicts diffracted beams originating from a pole of the quadrupole illumination mode adjacent to the pole of FIG. 7.

As shown in FIG. 8, the pattern 600 further diffracts the beam B2 in a zero and a first order diffracted beam, respectively beams DB20 and DB21. The beams DB20 and DB21 traverse a Fourier Transform plane in the projection system PS, e.g. the pupil plane PPp, in respective opposite areas AE20 and AE21. In contrast to the areas AE10 and AE11, the areas AE20 and A21 are disposed asymmetrically with respect to the optical axis OA, at respective different distances d20 and d21 from the optical axis OA. The difference between the diffracted beams originating from B1 and B2 is related to the difference between the pitches Px and Py of the contact holes 610 as arranged in rows parallel to the X-axis and Y-axis respectively. In particular, in comparison to features arranged at shorter pitch, features arranged at a longer pitch are less effective in diffracting radiation away from a zeroth order diffracted beam direction of a patterning device-illuminating beam.

Figure 9:
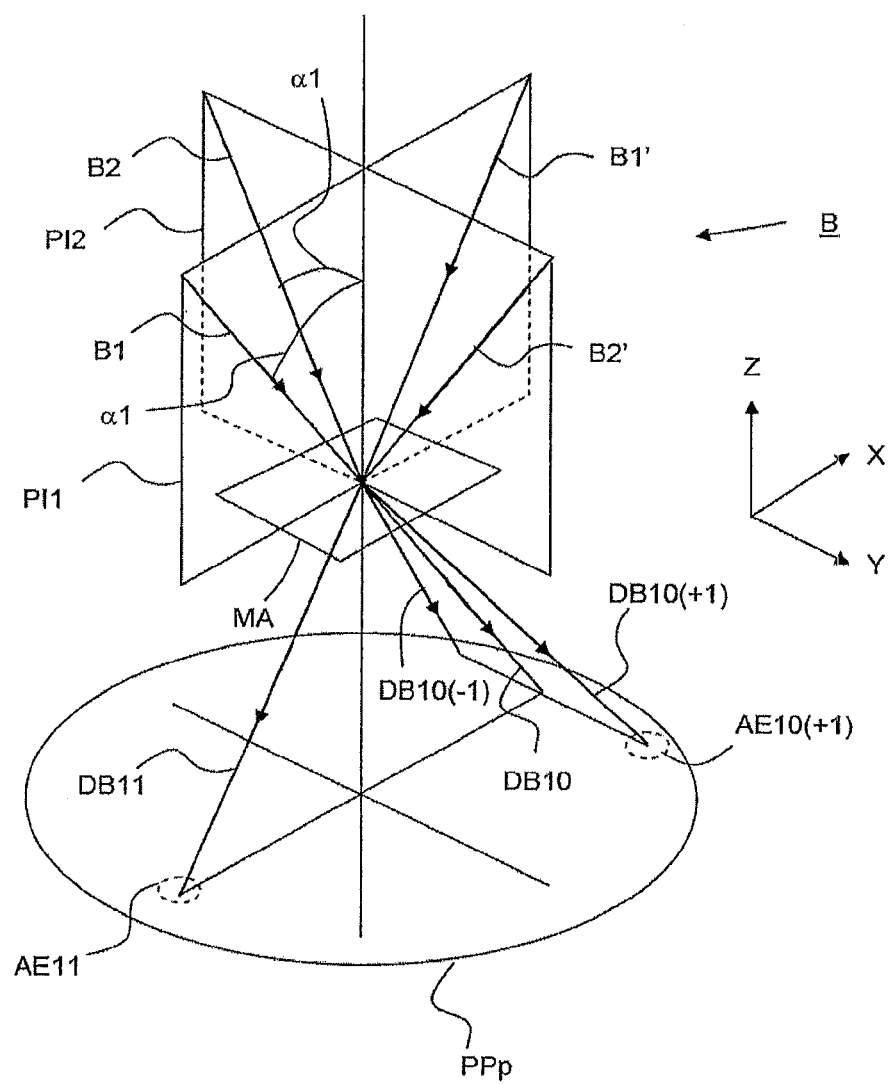
FIG. 9 depicts additional diffracted beams originating from the single beam of FIG. 7.

As illustrated in FIG. 9, besides a first first-order diffracted beam DB11 originating from the beam B1 impinging on the patterning device MA, two additional diffracted beams DB10(+1) and DB10(−1) originate from the beam B1. The first first-order diffracted beam DB11 is associated with the relative short pitch Px in pattern 600. The second and third first-order diffracted beams DB10(+1) and DB10(−1) are associated with the longer pitch Py of the pattern 600. The diffracted beams DB10(+1) and DB10(−1) are a plus-first order and a minus-first order diffracted beam respectively, oppositely and symmetrically inclined with respect to the plane PI1, being a notional plane comprising the zeroth order diffracted beam DB10 and the optical axis OA. At least portions of the beams DB10(+1) and DB10(−1) traverse a Fourier Transform plane in the projection system PS, e.g. the pupil plane PPp. Similarly, but not shown in FIG. 9, diffracted beams DB 10(+1)' and DB 10(−1)' originate from the beam B1'.

The beams DB10(+1) and DB10(−1) traverse, in use, the pupil plane PPp in respective areas AE10(+1) and AE10(−1) disposed oppositely and symmetrically with respect to the plane of incidence PI1, at respective equal distances d10(+1) and d10(−1) from the X-axis in the pupil plane PPp. Only area AE 10(+1) is shown in FIG. 9.

Figure 6C:
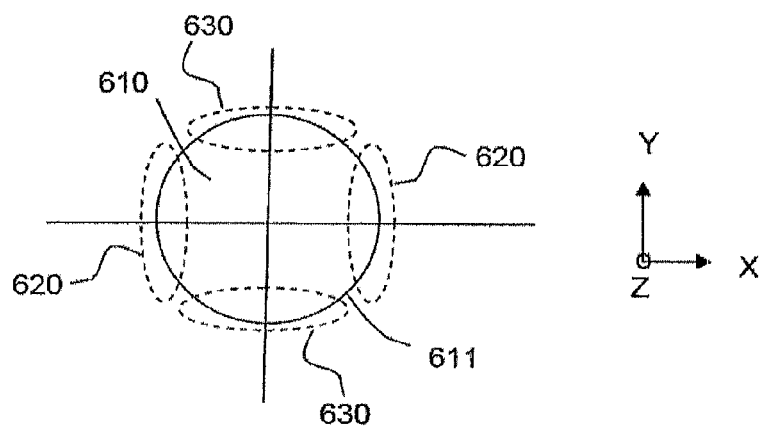
FIG. 6C illustrates different portions of an image of a contact hole of the pattern of FIG. 6A.

In the presence of quadrupole illumination such as illustrated in FIG. 5, an image of a contact hole 610 can be represented as a sum of 4 constituent images (images im1, im1', im2 and im2'), respectively generated by diffracted radiation originating from the four respective poles and beams B1, B1', B2, and B2' of the quadrupole illumination intensity distribution in the illumination pupil plane PPi. FIG. 6C illustrates an image of a contact hole 610, having an edge 611 (the edge may for example be a contour line of constant intensity) and areas 620 and 630 including portions of the edge 611.

A first image im1 of the sum of 4 images is generated by a recombination of the beams DB10, DB11, DB10(+1) and DB10(−1), just above and at the substrate W. The recombination of the three different first order diffracted beams with beam DB10 in the image im1 contributes mainly to contrast, resolution and image fidelity along the X-axis in the image of the contact hole pattern 600, resolving the portions 620 (including portions of the edge 611 of the contact hole 610 substantially parallel to the Y-direction) of the contact hole 610 better than portions 630 (including portions of the edge 611 of the contact hole 610 substantially parallel to the X-direction) of the contact hole 610. Diffracted beams originating from the beam B1' provide a similar image im1'.

A second image im2 is generated by the recombination of the beams DB20 and DB21 above and at the substrate, see FIG. 8. This second image contributes mainly to contrast, resolution and image fidelity along the Y-direction in the image of the pattern 600, resolving the portions 630 (including portions of the edge 611 of the contact hole 610 substantially parallel to the X-direction) of the contact hole 610 better than the portions 620 (including portions of the edge 611 of the contact hole 610 substantially parallel to the Y-direction) of the contact hole 610. A similar, second image im2' originates from diffracted beams generated by diffraction of the beam B2' at the pattern 600.

Figure 6D:
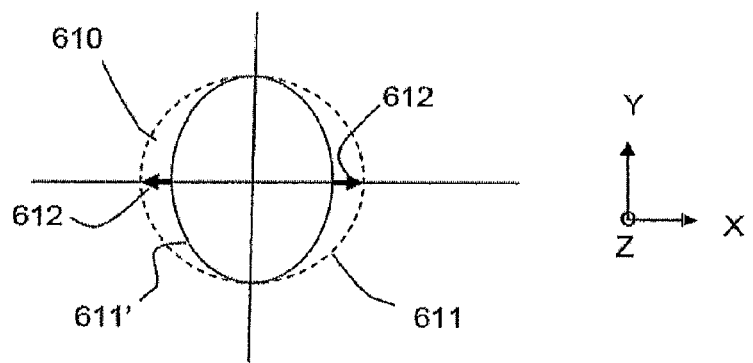
FIG. 6D illustrates a change of a shape of a contact hole of the pattern of FIG. 6A as obtained in an embodiment.

In the embodiment, a CD-error due to ellipticity, such as illustrated in FIG. 6B, is compensated by affecting the contribution to imaging of the portions 630 of the contact hole 610. This contribution arises from recombination of the first first-order diffracted beam DB11 with the second and third first-order diffracted beams DB10(+1) and DB10(−1). In the embodiment, there is applied a change of optical phase to the beams DB10(+1) and DB10(−1) with respect to the beam DB11. Further, there is applied a same change of optical phase to beams DB10(+1)' and DB10(−1)' with respect to the beam DB11'. An effect of such phase changes is illustrated in FIG. 6D. In FIG. 6D, the X,Y axes are centered with respect to the edge 611' of a contact hole as it would be printed without the phase shifts applied. As such the contact hole represents an image-feature having a shape as defined by the edge 611' in an image of the pattern. The phase changes lead to opposite shifts along the X direction of opposite portions of the edge 611' at and near the X-axis. The shifts are indicated by the arrows 612, and are mirror symmetric with respect to the Y-axis, thereby stretching the contact hole edge such as to desirably yield a circular edge 611.

Figure 10:
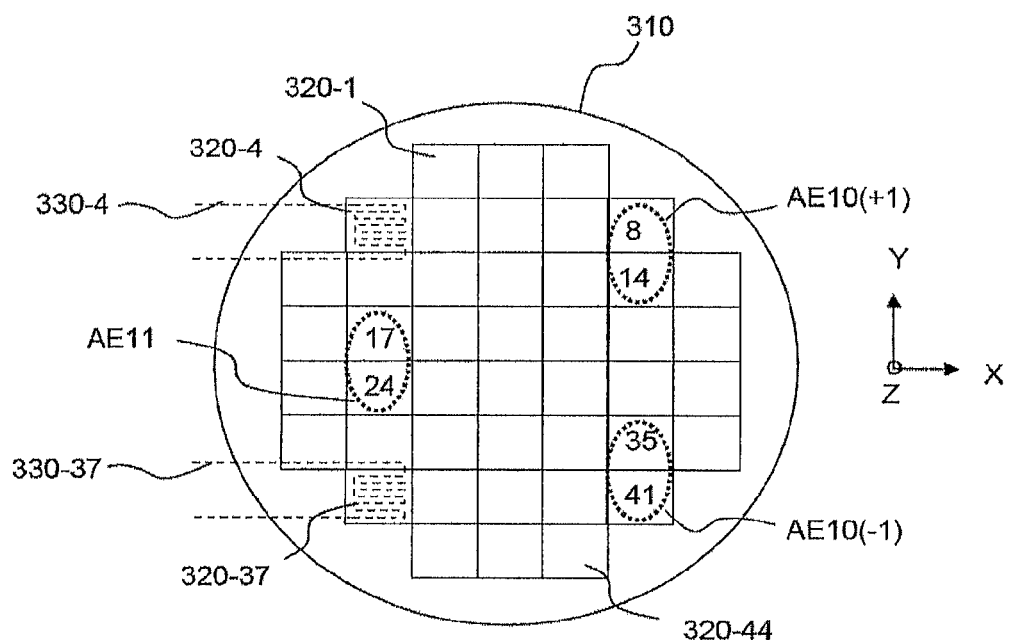
FIG. 10 depicts areas traversed by diffracted beams to which a change of phase is applied in an embodiment.

For example, a first change of optical phase may be applied to the beams DB10(+1) and DB10(−1) and a second change of optical phase may be applied to the beam DB11. The phase adjuster 110 is used to provide desired phase changes to the beams DB10(+1), DB10(−1) and DB11. First, data representative for the patterning device pattern 600 and the illumination mode are retrieved, by controller 340, from a patterning-device data-file and a file including illumination mode setting data. Next, an intensity distribution in the pupil plane PPp of the projection system is predicted based on data including the pattern and illumination data. Areas AE10(+1), AE10(−1) and AE11 are identified where the beams DB10(+1), DB10(−1) and DB11 traverse the optical element 310 of phase adjuster 110. A lithographic process optimization, e.g. arranged to minimize CD-error of features, is executed by the controller 340. Optimization variables used in the optimization include the aforementioned first and second change of optical phase. Desired first and second optical phases are calculated and stored. The identified areas AE10(+1), AE10(−1) and AE11 are mapped on the portions 320 of the optical element 310, and portions 320 substantially traversed by the respective beams DB10(+1), DB10(−1) and DB11 are identified and their addresses in relation to corresponding heating wires and/or cooling channels are stored. In an embodiment, the area AE10(+1) is assumed to correspond to the portions 320-8 and 320-14, as illustrated in FIG. 10. As further shown in FIG. 10, the area AE10(−1) is assumed to correspond to the portions 320-35 and 320-41 and the area AE11 is assumed to correspond to portions 320-17 and 320-24. Similar determinations may be made with respect to DB10(+1)', DB10(−1)' and DB11'.

In the embodiment, the desired first phase change for beams DB10(+1), DB10(−1) is a fraction $50/193$ of $2\pi$, and the desired phase change for beam DB11 is of equal magnitude but of opposite sign compared to the first phase change. The controller converts the desired phase changes into a respective desired first temperature for the portions 320-8, 320-14, 320-35 and 320-41, and a desired second temperature for the portions 320-17 and 320-24, at opposite temperature intervals from a desired nominal temperature for any of the other portions of 320-1 up to 320-44. Next, the controller determines and applies corresponding currents to the heating wires (and/or cooling fluid temperature to the channels). In a similar way desired phase changes are applied to the beams DB10(+1)', DB 10(−1)' and DB11' originating from beam B1'.

As noted above the invention is not limited to the specific embodiment of the phase adjuster 110. A further embodiment of a phase adjuster 110 may include an infrared laser (or a plurality of infrared lasers) arranged to selectively heat portions 320 of an optical element 310 disposed near the lens pupil $PP_p$.

The embodiment is not limited to stretching a shape of a contact hole. The feature may, instead of a contact hole, be a line segment or an arbitrary shaped feature having edge portions perpendicular to a line connecting the poles from which the beams B1 and B1' originate. The embodiment is also not limiting to stretching a feature; by inverting the signs of the phase changes, a shrinking of a feature size may be realized as well.

Simulations predict that applying the first and second phase changes as described above can result in a decrease of ellipticity for an image 610 of a contact hole.

Figure 11:
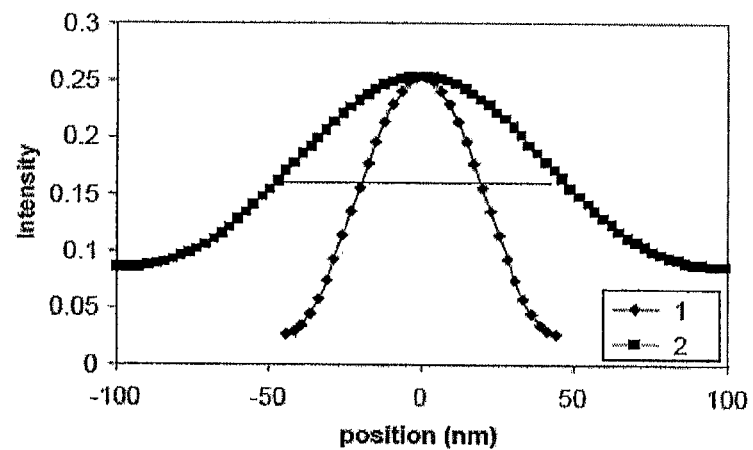
FIG. 11A illustrates two intensity distributions in two cross sections of an image of a contact hole of the pattern of FIG. 6A in the absence of optical phase changes applied according to an embodiment.
FIG. 11B illustrates two intensity distributions in two cross sections of an image of a contact hole of the pattern of FIG. 6A in the presence of optical phase changes applied according to an embodiment.
Figure 11:
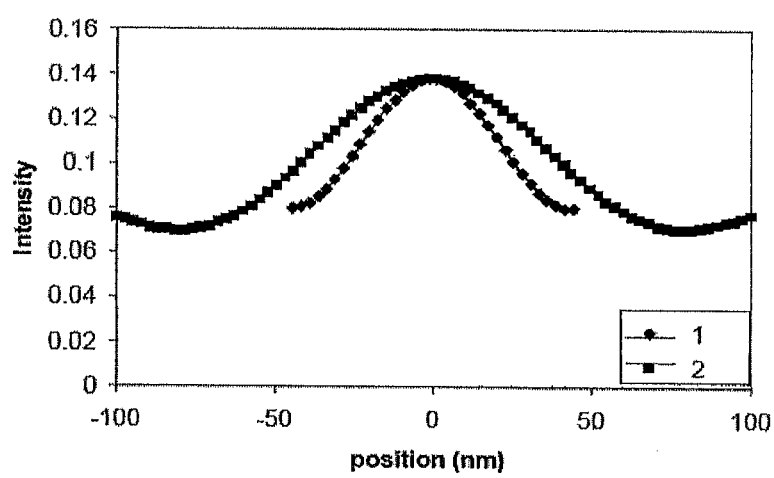

FIG. 11A illustrates an intensity distribution of an image of a contact hole 610, in the absence of a compensation for CD error of the embodiment. The intensity is plotted in arbitrary units along the vertical axis. Curve 1 represents the intensity distribution in the X,Z-plane and curve 2 the intensity distribution in the Y,Z-plane. At an intensity level where in the X,Z-plane the width of the curve is 42 nm, the width of the curve in the Y,Z-plane is 91 nm. The intensity level is representative for resist threshold intensity, so that an ellipticity of a contact hole is about 50 nm when expressed as a difference between printed CD along the Y axis and printed CD along the X axis.

FIG. 11B illustrates an intensity distribution of an image of a contact hole 610, in the presence of the compensation for CD error of the embodiment. The intensity is plotted in arbitrary units along the vertical axis. As in FIG. 10A, curves 1 and 2 represent the intensity distribution in the X,Z- and Y,Z-planes respectively. At an intensity level where in the X,Z-plane the width of the curve is 41 nm, the width of the curve in the Y,Z-plane is 52 nm. This intensity level again being representative for resist threshold intensity, the simulations indicate that the ellipticity (using the same definition) of contact hole 610 is reduced by a factor 5 to about 11 nm.

In an embodiment, there is provided a lithographic apparatus comprising: an illumination system configured to condition a radiation beam with an illumination mode including an off-axis radiation beam emerging from an illumination pole and inclined at an angle with respect to an optical axis; a support constructed to support a patterning device, the patterning device being capable of imparting the radiation beam with a pattern in its cross-section to form a patterned radiation beam and further being capable of diffracting the off-axis radiation beam into a first first-order diffracted beam associated with a first pitch of the pattern along a first direction, and a second first-order diffracted beam associated with a second pitch of the pattern along a different, second direction; a projection system having a pupil plane and configured to project the patterned radiation beam onto a target portion of the substrate; a phase adjuster constructed and arranged to adjust a phase of an electric field of a radiation beam traversing an optical element of the phase adjuster disposed in the pupil plane; and a controller constructed and arranged to retrieve data representative of the pattern and of the illumination mode, to identify an area where the first-order diffracted beam traverses, in use, the pupil plane, to optimize an image characteristic of an image of the pattern by calculating a desired optical phase of the first-order diffracted beam in relation to the optical phase of the second first-order diffracted beam, to map the area on a portion of the optical element, and to apply heat to or extract heat from, the portion to change the index of refraction of the optical element in accordance with the desired optical phase.

In an embodiment, the image characteristic is a shape of an image-feature in the image. In an embodiment, the illumination mode is a quadrupole illumination mode including a first and a second beam, emerging from a respective first and an adjacent second pole and both inclined at the angle with respect to the optical axis. In an embodiment, the image characteristic is a shape of an image-feature in the image.

In an embodiment, there is provided a device manufacturing method comprising transferring a pattern from a patterning device onto a substrate, the method including: illuminating, with a radiation beam having an illumination mode including an off-axis radiation beam emerging from an illumination pole and inclined at an angle with respect to an optical axis, a patterning device, the patterning device imparting the radiation beam with a pattern in its cross-section to form a patterned radiation beam and further diffracting the off-axis radiation beam into a first first-order diffracted beam associated with a first pitch along a first direction in the pattern, and into a second first-order diffracted beam associated with a second pitch along a different, second direction in the pattern; projecting the patterned radiation beam via a pupil plane onto a target portion of the substrate; adjusting a phase of an electric field of a radiation beam traversing an optical element disposed in the pupil plane, the adjusting including: retrieving data representative of the pattern and of the illumination mode, identifying an area where the first-order diffracted beam traverses the pupil plane, optimizing an image characteristic of an image of the pattern by calculating a desired optical phase of the first-order diffracted beam in relation to the optical phase of the second first-order diffracted beam, mapping the area on a portion of the optical element, and applying heat to or extracting heat from, the portion to change the index of refraction of the optical element in accordance with the desired optical phase.

In an embodiment, the image characteristic is a shape of an image-feature in the image. In an embodiment, the illumination mode is a quadrupole illumination mode including a first and a second beam, emerging from a respective first and an adjacent second pole and both inclined at the angle with respect to the optical axis. In an embodiment, the image characteristic is a shape of an image-feature in the image.

In an embodiment, there is provided a phase adjustment system, comprising: a phase adjuster constructed and arranged to adjust a phase of an electric field of a radiation beam traversing an optical element of the phase adjuster disposed, in use, in a pupil plane of a projection system configured to project a patterned radiation beam onto a target portion of a substrate, the patterned radiation beam having a pattern formed by a patterning device diffracting an off-axis radiation beam emerging from an illumination pole and inclined at an angle with respect to an optical axis into a first first-order diffracted beam associated with a first pitch of the pattern along a first direction, and a second first-order diffracted beam associated with a second pitch of the pattern along a different, second direction; and a controller constructed and arranged to retrieve data representative of the pattern and of the illumination pole, to identify an area where the first-order diffracted beam traverses, in use, the pupil plane, to optimize an image characteristic of an image of the pattern by calculating a desired optical phase of the first-order diffracted beam in relation to the optical phase of the second first-order diffracted beam, to map the area on a portion of the optical element, and to apply heat to or extract heat from, the portion to change the index of refraction of the optical element in accordance with the desired optical phase.

In an embodiment, the image characteristic is a shape of an image-feature in the image. In an embodiment, the illumination pole is part of a quadrupole illumination mode including a first and a second beam, emerging from a respective first and an adjacent second pole and both inclined at the angle with respect to the optical axis. In an embodiment, the image characteristic is a shape of an image-feature in the image.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   a projection system configured to project a patterned radiation beam onto a target portion of a substrate, the patterned radiation beam having first first-order radiation and second first-order radiation to form an image of at least part of a pattern of the patterned radiation beam;
   a phase adjuster constructed and arranged to adjust an optical phase of radiation of a radiation beam traversing an optical element of the phase adjuster; and
   a controller constructed and arranged to control the phase adjuster to selectively vary a property of the optical element in an area where the first first-order and/or the second first-order radiation traverses, in use, the optical element in order to provide an optical phase difference between the first first-order radiation and the second first-order radiation to alter an image characteristic of the image.

2. The lithographic apparatus of claim 1, wherein the image characteristic is a shape of an image-feature in the image.

3. A device manufacturing method comprising transferring a pattern from a patterning device onto a substrate, the method including:
   projecting a patterned radiation beam onto a target portion of the substrate, the patterned radiation beam having first first-order radiation and second first-order radiation to form an image of at least part of a pattern of the patterned radiation beam;
   adjusting an optical phase of radiation of the patterned radiation beam using a phase adjuster to alter an image characteristic of the image, the adjusting comprising controlling the phase adjuster to selectively apply an optical phase difference between the first first-order radiation and the second first-order radiation traversing the phase adjuster.

4. The method of claim 3, wherein the image characteristic is a shape of an image-feature in the image.

5. The lithographic apparatus of claim 1, wherein the image characteristic is critical dimension of an image-feature in the image.

6. The lithographic apparatus of claim 1, wherein the first first-order radiation is associated with a first pitch of the pattern along a first direction and the second first-order radiation is associated with a second pitch of the pattern along a different, second direction.

7. The lithographic apparatus of claim 1, wherein the controller is further constructed and arranged to identify the area where the first first-order and/or the second first-order radiation traverses, in use, the optical element based on data representative of the pattern and of an illumination mode applied to the radiation of the patterned radiation beam.

8. The lithographic apparatus of claim 1, further comprising an illumination system configured to condition a radiation beam with an illumination mode including an off-axis radiation beam emerging from an illumination pole and inclined at an angle with respect to an optical axis, wherein the first first-order radiation and the second first-order radiation are formed from radiation from the illumination pole.

9. The lithographic apparatus of claim 1, wherein the controller is configured to calculate a value of the optical phase difference to cause a certain change of a shape and/or critical dimension of an image-feature in the image.

10. The lithographic apparatus of claim 1, wherein the second first-order radiation is inclined at an angle to a plane comprising an optical axis of the patterned radiation beam and zeroth-order radiation associated with the first first-order radiation.

11. The method of claim 3, wherein the second first-order radiation is inclined at an angle to a plane comprising an optical axis of the patterned radiation beam and zeroth-order radiation associated with the first first-order radiation.

12. The method of claim 3, wherein the image characteristic is critical dimension of an image-feature in the image.

13. A lithographic apparatus comprising:
a projection system configured to project a patterned radiation beam onto a target portion of the substrate;
a phase adjuster constructed and arranged to adjust an optical phase of radiation of the patterned radiation beam traversing the phase adjuster, the phase adjuster configured to apply energy to or extract energy from a part of an optical element of the phase adjuster to cause an optical phase difference; and
a controller configured to control the phase adjuster to selectively apply the optical phase difference to at least a portion of the patterned beam to modify a critical dimension of a feature of a pattern image projected by the patterned beam, and further constructed and arranged to identify an area where at least the portion of the patterned beam traverses, in use, the optical element based on data representative of the pattern and of an illumination mode applied to the radiation of the patterned radiation beam.

14. The lithographic apparatus of claim 13, wherein the controller is configured to selectively apply the optical phase difference to modify the critical dimension of the feature in one direction differently than the critical dimension of the feature in another direction.

15. The lithographic apparatus of claim 13, wherein the controller is further configured to calculate a value of the optical phase difference to cause a certain change of the critical dimension of the feature.

16. The lithographic apparatus of claim 13, wherein the patterned radiation beam has first first-order radiation and second first-order radiation to form an image of the feature and the controller is configured to control the phase adjuster to selectively apply the optical phase difference between the first first-order radiation and the second first-order radiation.

17. The lithographic apparatus of claim 16, wherein the first first-order radiation is associated with a first pitch of the pattern along a first direction and the second first-order radiation is associated with a second pitch of the pattern along a different, second direction.

18. The lithographic apparatus of claim 16, further comprising an illumination system configured to condition a radiation beam with an illumination mode including an off-axis radiation beam emerging from an illumination pole and inclined at an angle with respect to an optical axis, wherein the first first-order radiation and the second first-order radiation are formed from radiation from the illumination pole.

19. A non-transitory computer readable storage medium having a computer program stored therein to cause a computing device to perform a method of processing a patterned radiation beam having first first-order radiation and second first-order radiation to form an image of at least part of a pattern of the patterned radiation beam on a substrate, the method comprising:
identifying an area where the first first-order and/or the second first-order radiation traverses, in use, an optical element of an optical phase adjuster; and
instructing the optical phase adjuster to adjust an optical phase of radiation of the patterned radiation beam to alter an image characteristic of the image, the adjusting comprising controlling the phase adjuster to selectively apply an optical phase difference between the first first-order radiation and the second first-order radiation traversing the phase adjuster.

* * * * *

UNITED STATES PATENT AND TRADEMARK OFFICE
CERTIFICATE OF CORRECTION

PATENT NO. : 8,786,828 B2  
APPLICATION NO. : 13/848595  
DATED : July 22, 2014  
INVENTOR(S) : Jozef Maria Finders Page 1 of 1

It is certified that error appears in the above-identified patent and that said Letters Patent is hereby corrected as shown below:

On Title Page, Item (71) Applicant:
 replace "Jozef Marie Finders"
 with --Jozef Maria Finders--.

On Title Page, Item (72) Inventor:
 replace "Jozef Marie Finders"
 with --Jozef Maria Finders--.

Signed and Sealed this
Fourteenth Day of October, 2014

Michelle K. Lee
*Deputy Director of the United States Patent and Trademark Office*